United States Patent [19]

Nagazumi

[11] Patent Number: 5,530,953
[45] Date of Patent: Jun. 25, 1996

[54] APPARATUS FOR RELOCATING SPATIAL INFORMATION FOR USE IN DATA EXCHANGE IN A PARALLEL PROCESSING ENVIRONMENT

[75] Inventor: Yasuo Nagazumi, 6-14-20, Ootsuka, Bunkyoueku, Japan

[73] Assignees: Yasuo Nagazumi; G.D.S. Co., Ltd., both of Japan; a part interest

[21] Appl. No.: 436,985

[22] Filed: May 8, 1995

Related U.S. Application Data

[63] Continuation of Ser. No. 976,346, Nov. 13, 1992, abandoned.

[30] Foreign Application Priority Data

Nov. 15, 1991 [JP] Japan .................................. 3-326941
Dec. 16, 1991 [JP] Japan .................................. 3-352789

[51] Int. Cl.⁶ ............................ G06F 3/05; G06F 17/17; G06F 7/60
[52] U.S. Cl. ............................ 395/800; 364/DIG. 1; 364/DIG. 2; 364/716; 395/27; 395/2.41; 365/69
[58] Field of Search .................... 395/25, 800, 2.1, 395/2.68, 24, 88, 27, 2.41; 364/DIG. 1, DIG. 2, 861, 724.12, 413.19; 365/69, 221, 230.05, 73; 342/372; 345/146.2; 371/50.1, 40.3

[56] References Cited

U.S. PATENT DOCUMENTS

| | | | |
|---|---|---|---|
| 4,962,381 | 10/1990 | Helby, Sr. | 342/372 |
| 4,962,483 | 10/1990 | Lodhi | 365/78 |
| 5,008,833 | 4/1991 | Aglannt et al. | 395/25 |
| 5,051,832 | 9/1991 | Losse et al. | 358/213.29 |
| 5,060,189 | 10/1991 | Ota | 365/69 |
| 5,062,077 | 10/1991 | Takashima et al. | 365/69 |
| 5,117,388 | 5/1992 | Nakano et al. | 365/78 |
| 5,270,963 | 12/1993 | Allen et al. | 364/861 |
| 5,311,477 | 5/1994 | Rastejah | 365/69 |
| 5,321,387 | 6/1994 | Terada et al. | 365/78 |

OTHER PUBLICATIONS

Fortes, José et al.; Systolic Arrays From Concept To Implementation; Jul. 1987; pp. 12–17.
Systolic Arrays–From Concept to Implementation; José H. B. Fortes; Benjamin Wah, Jul. 1987 IEEE pp. 12–17.

*Primary Examiner*—Daniel H. Pan
*Attorney, Agent, or Firm*—King & Schickli

[57] ABSTRACT

The apparatus includes a plurality of groups of plural data paths which are connected in such a manner that each data path of one group intersects with one or more data paths of another or more data path groups. Each data path of each group is composed of a shift register and at least one of the data paths of each group transfer a signal imputed thereto in a different direction from at least one of the remaining data paths thereof when one of the shift registers thereof is operated. The plurality of data path groups are arranged such that each data path of one group shares with one or more data paths of another one or more groups one or more data lines at one of more positions of those data paths except end positions thereof, and the data path groups sharing at least one data line with one another effect transfer operation of a signal within one time interval independently allotted to each of the groups, thereby permitting the signal on the data line to be transferred in a direction designated for each data path group when each group has effected the transfer operation of a signal.

21 Claims, 16 Drawing Sheets

STRUCTURE OF Ⓜ

INCLINATION OF LINES
REPRESENTED BY UNIT $D_i$

APPARATUS FOR RELOCATING SPATIAL INFORMATION FOR USE IN DATA EXCHANGE IN A PARALLEL PROCESSING ENVIRONMENT

This is a continuation of application Ser. No. 07/976,346, filed Nov. 13, 1992, now abandoned.

BACKGROUND OF THE INVENTION

1. Field of the Invention

The present invention relates to an apparatus for relocating spatial information for use in, for example, a pattern information processing apparatus, a data processor, a spatial filter apparatus, a parallel computer, and a systolic array processor.

2. Description of the Prior Art

It is well known that the visual function of animals is an important function which may relate to the preservation of the species, so that it has become a highly developed organ through the process of evolution.

The investigation on artificial simulation of a pattern recognition function, represented by the visual sense, was begun in the 1950's on the basis of analog techniques. With the subsequent development of digital techniques, the investigation on pattern recognition systems by computer processing is now in progress in a variety of fields.

Perceptron by Rosenblatt is well known as an example of a pioneer investigation of this kind, the structure of which is schematically shown in FIG. 1.

The perceptron is a kind of hierarchical neural network comprising three layers S, A and R. More specifically, the perceptron is formed by the S-layer (sensing layer) corresponding to a receptor, the A-layer (association layer) corresponding to a bipolar cell, the R-layer (reaction layer) corresponding to a ganglion, and random connections corresponding to groups of synapses for coupling the S-, A- and R-layers, where a series of input patterns and a multiplicity of expected outputs are provided. While these expected outputs are repeatedly proposed, a parameter for the R-layer is controlled to gradually approach an actual output and thereby improve the ratio of generating a true answer.

Although the perceptron was an extremely epoch-making system as a learning machine and exhibited considerable performance for problems within a limited range, the results of subsequent logical analysis has found that there are a large number of problems which cannot be solved by this system. For this reason, the perceptron is now hardly studied, however, investigation on improvement of this kind of system is still in progress on the basis of the perceptron in a variety of industrial fields.

On the other hand, since a large volume of processing is required for acquired data, it is necessary to make countermeasures for complicated processing, for example, high speed processing by using a plurality of processors. It is said that processing by the conventional Neumann type computer has already reached its limit.

For this reason, the computer architecture is being radically reviewed for such an application in a variety of fields. One of these approaches is a systolic array processor.

The systolic array processor is a system in which a multiplicity of single-function processors are plainly located, and respective adjacent processors are coupled through data lines with each other. Then, data parallelly supplied from the processor located at the end are processed by the individual processors to perform composite pipe-line processing. Thus, the systolic array processor was developed for the purpose of deriving parallel outputs at a high speed. This system allows a special processor for performing matrix calculation and so on requiring an immense time for processing to be implemented by integrated circuits.

The sequential type digital processing, although advantageously capable of accessing arbitrary data in a given data range and processing the data correctly, typically incurs a rapid and large increase in cost with respect to both hardware and software if an immense amount of data such as visual information is to be processed at a high speed.

According to the results of an investigation on the visual sense of animals, it is regarded that remarkable information processing has already been performed at the retina which serves as receptor, and the visual sense center in the brain receives summarized results transmitted thereto which may be called "essence." From this point of view, there have been made many attempts on simulating the retina by analog electronic circuits, and many results have already been reported.

It is said that not only the retina but also the neural organization in general is constituted by complicated synapses couplings between a plurality of neural cells. If such an organization is actually simulated by electronic circuits, the realization of the synaptic couplings suffers from considerable difficulties, and a large amount of spatial connections are required. For example, the perceptron actually simulates synaptic coupling in this way, however, connections in hardware are not easily changed, thereby presenting a low freedom.

OBJECTS AND SUMMARY OF THE INVENTION

The present invention has been made in view of the abovementioned problem, and its object is to provide an apparatus for relocating spatial information which is applicable to data exchange in a parallel processing environment.

Specifically, the apparatus according to the present invention comprises a plurality of groups of plural data paths, and each data path of each data path group is composed of a shift register having a number of signal storage means arranged in cascade connection via data lines, and the plural data paths of each group are located in non-intersecting manner. At least one of the data paths of each group transfer a signal input thereto in a different direction from the remaining data paths thereof when the shift register thereof is operated. The plurality of data path groups are arranged such that each data path of one group shares with one or more data paths of another one or more groups one or more data lines at one or more positions of those data paths except end positions thereof, and the data paths groups sharing at least one data line with one another effect transfer operation of a signal within one time interval independently allotted to each of the groups, thereby permitting the signal on the data line to be transferred in a direction designated for each data path group when each group has effected the transfer operation of a signal. The shift registers are implemented by analog shift registers such as CCD (Charge Coupled Device) and digital data latch devices, and the number of the data path groups is two or more. Some or all of the shift register stages are also provided with opto-electric transducer elements, such that an external optical stimulation is directly fetched as an analog or digital electric signal. Calculation sections are dispersively located for performing a variety of calculations based on electric signals held by a plurality of the adjacent shift register. Electric signals representing the calculation results of the calculation sections are returned to the shift register stages on the path.

The apparatus for relocating spatial information may be provided with a mechanism for transducing the calculation results to electromagnetic wave output signals such as infrared beam signals which are modulated by the signals representing the calculation results.

In the present invention, these spatial connections are artificially realized through a spatial data bus (hereinafter referred to as "the SDB") which is formed of shift registers.

A shift register consists of a number of memory devices arranged in cascade connection via data lines such that the output of one of the memory devices is connected to the input of the next memory device through a data line. A common clock signal is used to sequentially send the data in the forward direction. The shift registers are roughly divided, in terms of their structure, into analog shift registers such as CCD and digital shift registers formed of a flip-flop circuit and so on.

The basic concept of the SDB is common to either of the analog and digital types, and explanation on one of them is sufficient to understand both types, so that the analog type will be mainly explained, and additional explanation will be given for the digital type.

At present, a CCD widely employed for video cameras and so on is a typical charge transfer device. This is a device which confines an input signal converted to a charge amount in "a potential well" travelling on the surface of the semiconductor by means of a driving voltage from an external electrode adapted to perform the transfer. There are other devices which are constructed to transfer a signal in the form of charges. Although their operation principles are different from the CCD, their functions are similar, so that it will be sufficient to mainly explain the CCD to understand all types of analog shift registers.

The SDB utilizes a signal transfer function performed by the CCD or the like, but not in a single direction like an imaging device, to realize a function of converging data dispersed on a plane to a point and, conversely, a function of dispersing data at a point to its surrounding by alternately transferring data through a multiplicity of transfer paths which cross with each other.

The operation of the SDB may be easily understood, for example, by analogy to an urban bus. The urban bus goes around a town along a predetermined itinerary. People at several locations in this town take this bus to gather at one location. The operation of the SDB is similar to this situation.

Driving paths of the SDB can take a variety of forms in accordance with driving amounts of the respective paths and the order of driving. Accordingly, a flexible selection is allowed in conformity with an application. For example, converging signals may be positioned at apices of a regular hexagon to its center, or at substantially linearly aligned six points to a single point, and so on.

An input signal to the SDB may be any charge signal. Particularly, an optical input signal can be easily generated by placing opto-electric transducer elements around the SDB in a manner similar to an imaging device.

A CCD can perform, other than the transfer function, calculation functions such as an ordinary binary logic calculation, analog calculation such as addition, multi-value logic calculation, multi-value A/D conversion function, maximum value selection function, fuzzy logic operation, and so on. If the SDB is provided with a calculation unit having these functions, a series of signals converged from the surrounding to a single point, as described above, can be collected and locally processed to output the results.

The processing results can be transmitted to the outside directly through a wire or through the SDB as well as modulated to electromagnet wave output signals such as infrared LED to be directly transmitted to the outside.

A gap formed between paths of the SDB is called "the cell." Such cells can be dispersively placed in accordance with applications of the foregoing input, calculation and output functions.

Since such processing can be transferred to a cell having another calculation function and added to a higher grade operation by again returning the processing results to the SDB, it is appropriate to progress to higher level processing.

The above is an explanation on the analog type shift register utilizing a CCD. The CCD is adapted to hold a unit of analog information in a single shift register stage and can generally handle multi-value information. Therefore, to digitally realize a mechanism similar to the CCD, it is necessary to set a bit width of a shift register to two or more to constitute a parallel register.

It is also expected that a digital SDB is effectively utilized as a data transfer line of a systolic array processor which is a kind of a parallel computer.

The systolic array is generally based on communications between adjacent processors and executes data transfer through several processors located in the midway for communications between spatially separated devices. However, since each processor performs input/output operations at the same time in synchronism with a common clock signal, a long distance data transfer will take much time.

When the contents of processing executed by a processor are high-grade (when the grading is high), a time required for processing becomes relatively long, and a sufficient number of transfer processing can be executed during this time by shift registers and so on, so that the SDB, if utilized in such a case, allows the transfer processing to speed up.

Specifically, The SDB is disposed between arrays as a data transfer line for the systolic array and driven by a transfer clock which is sufficiently faster than a processing clock of the processor.

DESCRIPTION OF THE PREFERRED EMBODIMENTS

One embodiment of the present invention will hereinafter be described with reference to the accompanying drawings.

First, the definitions of terms employed herein will be explained:

Stage: Individual information holding means constituting a spatial data bus. In the case of a CCD, a stage refers to a potential well formed beneath a particular electrode corresponding to a clock. In the case of a digital type, a stage refers to an individual parallel register.

Number of path groups (L): The number of total path groups within the number of all paths when regarding paths which are always shifted at the same time as a path group.

Cross Degree (X): When a single SDB device is taken, the number of other SDB devices connected thereto is the cross degree, wherein the number of input/output devices are not included.

Intersection ratio (Y): The ratio of intersections in a particular degree to all intersections within all SDB devices.

Node: A stage at which two or more paths cross.

Arc: A stage which is associated only with a single path, or a series thereof.

Node signal: information held at a node at a time serving as the base for a starting time of, for example, a series of shift operations.

Arc signal: Information held at an arc at the abovementioned time.

Figure 1:
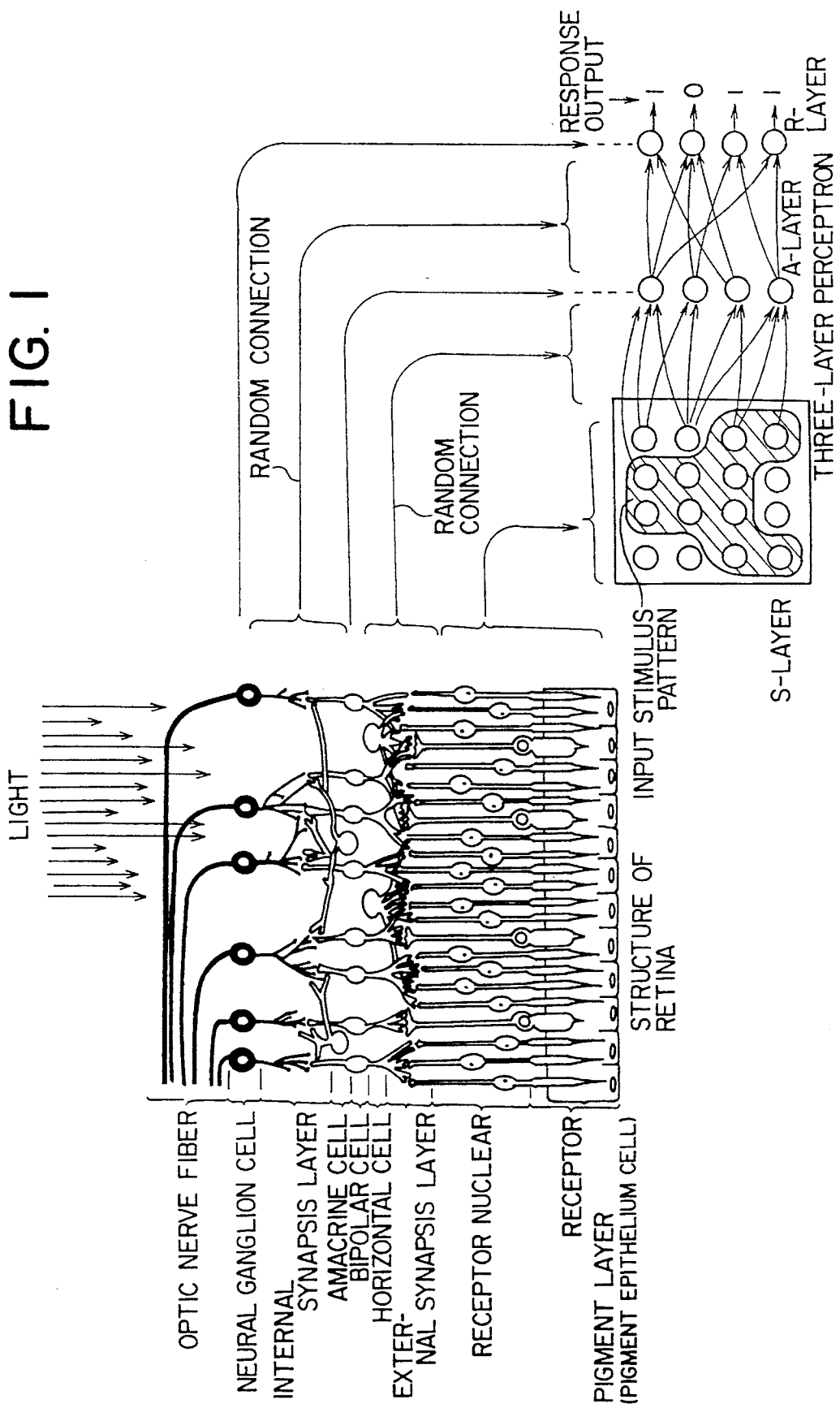
FIG. 1 is a diagram illustrating the relationship between the retina organization and a three-layer perceptron.
Figure 2:
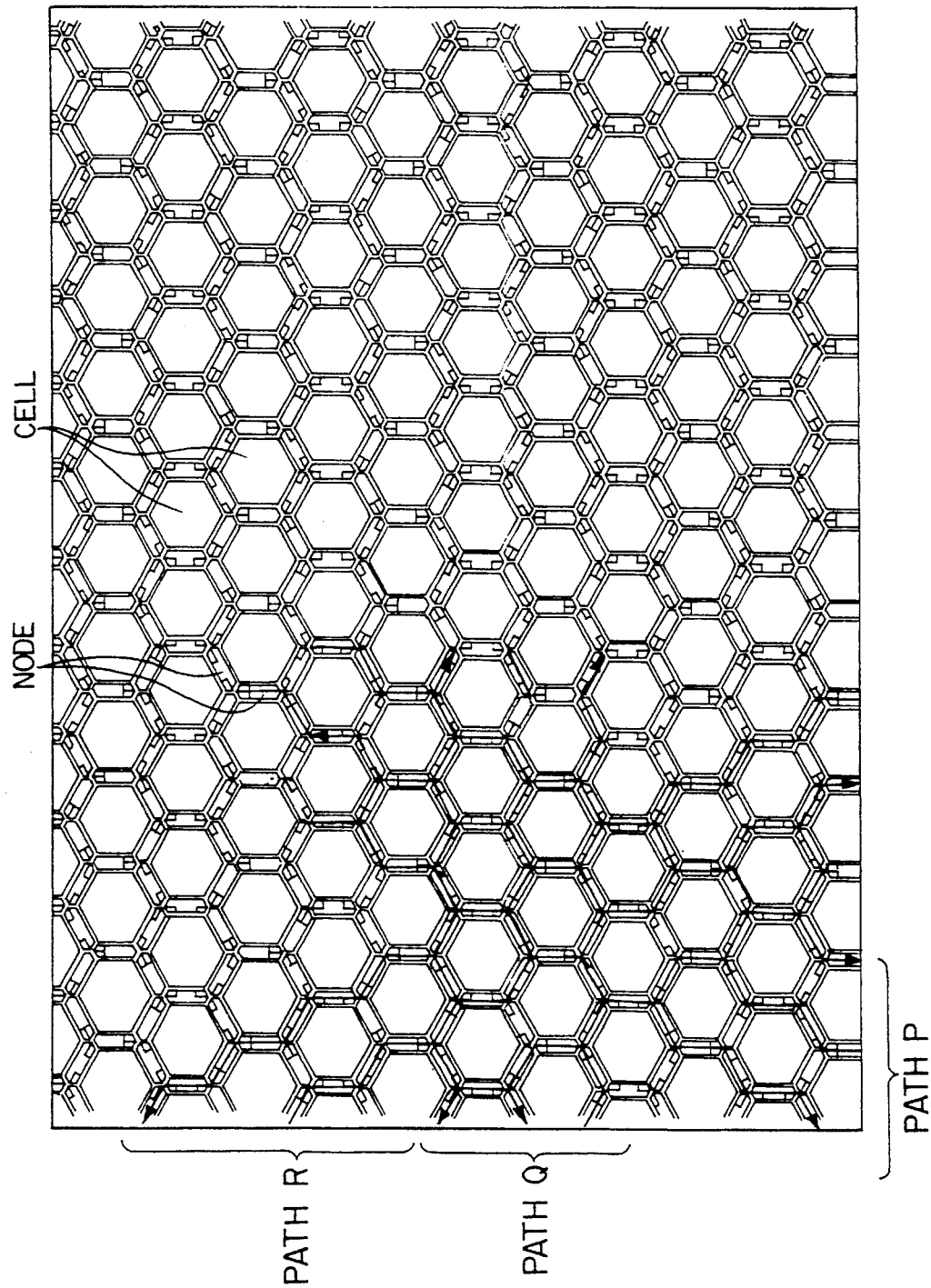
FIG. 2 is a diagram illustrating the structure of an SDB according to a first embodiment of the present invention.

FIG. 2 illustrates an example of the structure of an SDB when:

Number of path group L=3;

Maximum gross degree Xmax=4; and

Fourth degree intersection ratio Y4=100% (only including nodes without arc), as a relatively simple example.

In FIG. 2, signal transfer mechanisms inherent to individual systems are omitted, and the direction of a transfer output alone is indicated by hatching, for avoiding complexity.

Macroscopically, the structure illustrated in FIG. 2 comprises three path groups P, Q and R which cross with each other with an angle of 120°, with all intersections being of degree 4. Paths constituting each path group are assigned a shift direction opposite to that assigned to paths belonging to the adjacent path group.

The path groups P, Q and R constituting the SDB is sequentially shifted, while the SDB itself is shifted in conformity with the following principle.

Thinking of a case where the shift operation of the SDB conforms to the principle defining that shifting must not be performed along paths having mutual intersections, each stage on the SDB pauses a shift operation except for a time block allocated to a path associated with the stage.

In the example of FIG. 2, since all the stages respectively relate to two paths, a pause period enters while transfer along the remaining one path is being executed.

In most cases, the shift operation of the SDB may be performed a finite number of times to achieve the object. However, if the shifting direction is fixed for each path, this series of operations are uniquely expressed by a finite number of sequences of P, Q and R. This sequence is defined as a driving vector (V) of the SDB. For example, the driving vector is as follows:

$$V = (P, Q, P, Q, Q, Q, P, P, P) \tag{1}$$

Figure 5:
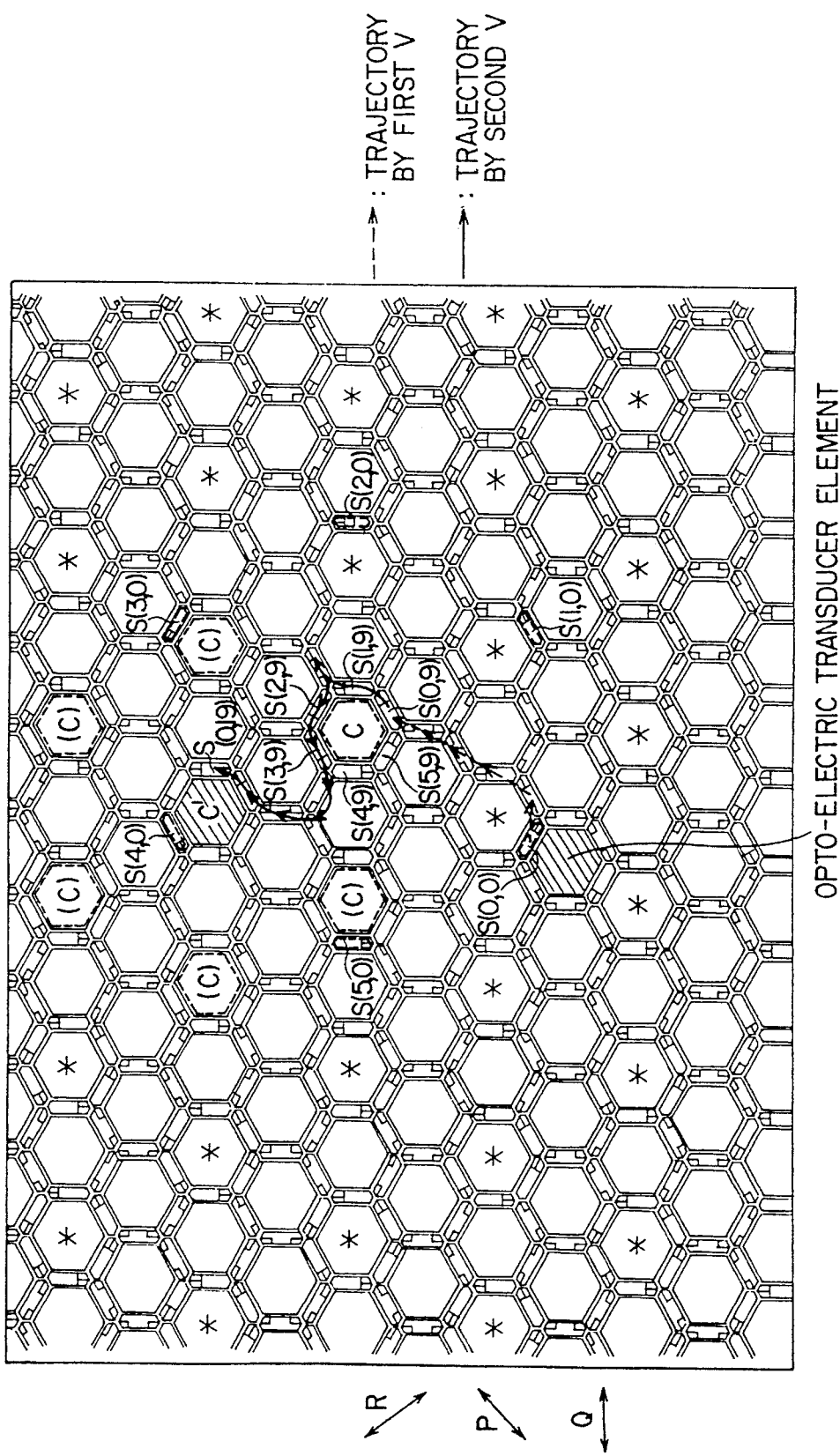
FIG. 5 is a trajectory diagram showing the itinerary followed by a signal at a point in the SDB of the first embodiment.

The equation 1 happens to be a vector which includes no shift in the R direction. FIG. 5 illustrates an itinerary along which a signal at a point follows when this operation is repeatedly executed by the SDB of FIG. 2.

Supposing that output signals of opto-electric transducer elements disposed in cells surrounding an initial position $S(0, 0)$ of this point have been realized, these signals reach a position $S(0, 9)$ after performing the shifting operation ten times defined by the driving vector V. According to the above-mentioned operation of the driving vector V, it is understood that five points positioned around a cell C adjacent to $S(0, 0)$, and initial positions $S(1, 0)$ and $-S(5, 0)$ of $S(1, 9)$ and $-S(5, 9)$ are placed to form a regular hexagon together with $S(0, 0)$.

Stated another way, originally dispersed spatial information is collected in the vicinity of the cell C, so that it equals to six spatial wires artificially realized by the SDB. If this cell is provided with an operating circuit, these dispersed input signals are readily collected.

Incidentally, cells indicated by "*" in FIG. 5 are all equivalent to the cell C, which can all be provided with the operating function, if necessary. If the result of the operation is relocated to either of $S(0,9)$ and $-S(5, 9)$, this signal is transferred to a cell C' which further has an upper level operating function.

Figure 6:
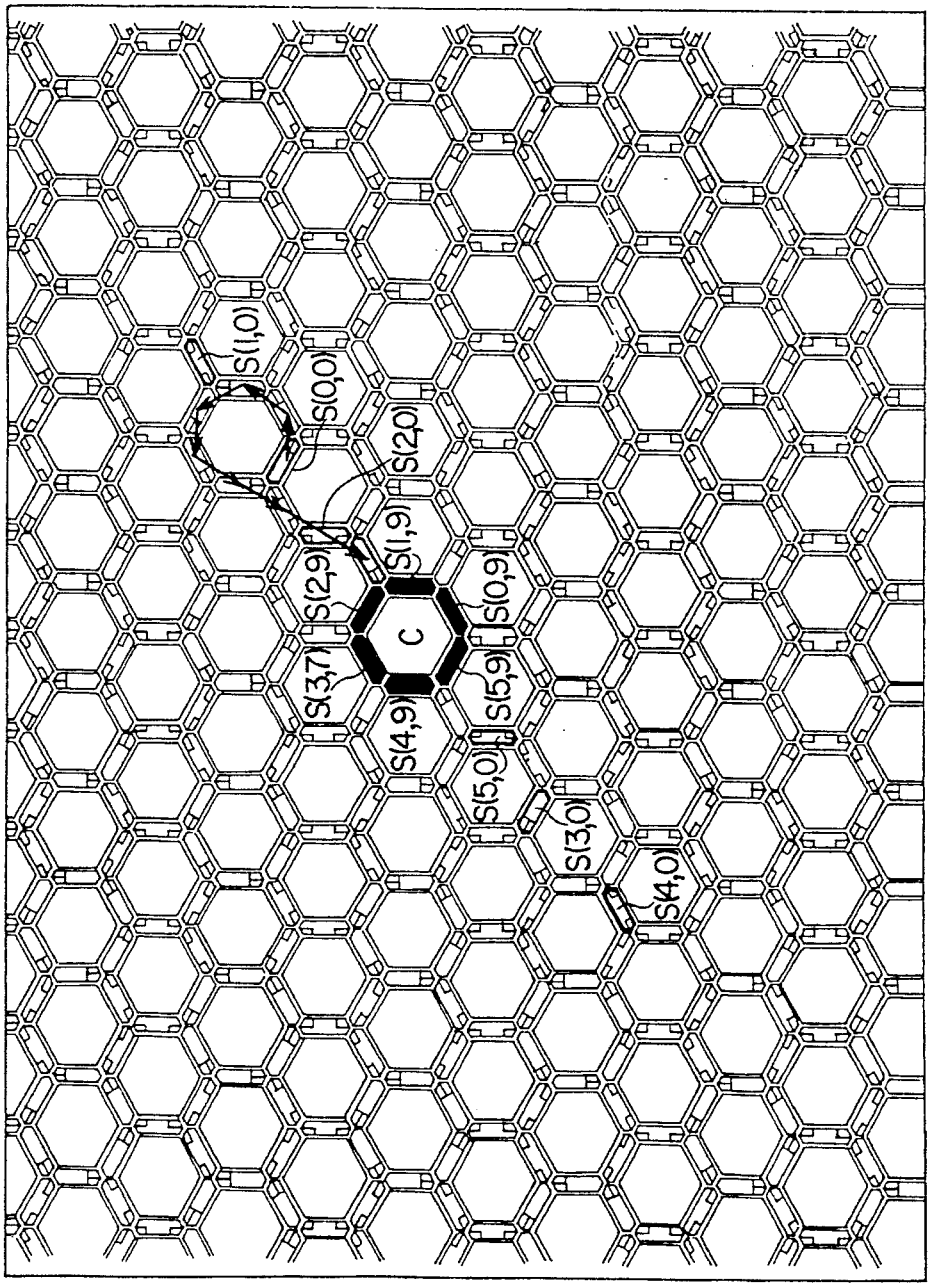
FIG. 6 shows initial points S(N, 0) which converge at a cell C in the SDB of the first embodiment, and indicates a movement of a signal by a predetermined operation.

When the initial position $S(N, 0)$ for collecting to the cell C employs a vector V other than that expressed by the equation 1, it presents a variety of completely different forms, an example of which is illustrated in FIG. 6.

The above explanation has been given of a case where input signals are realized from the position S(N, 0). Next, consideration will be made to a further extended case where optical signals from peripheral input cells are simultaneously taken into all the SDB stages immediately before a starting time of the operation V.

In this case, with an optical signal of an input cell nearest from the cell C along each signal trajectory being the head, optical signals at different positions sequentially reach the cell C each time a shift is performed, and signals at S(0,0) and -S(5, 0) arrive of course in the tenth shift.

If the cell C receives all signals arriving during this period, it is possible to further collect signals from more positions.

Figure 3:
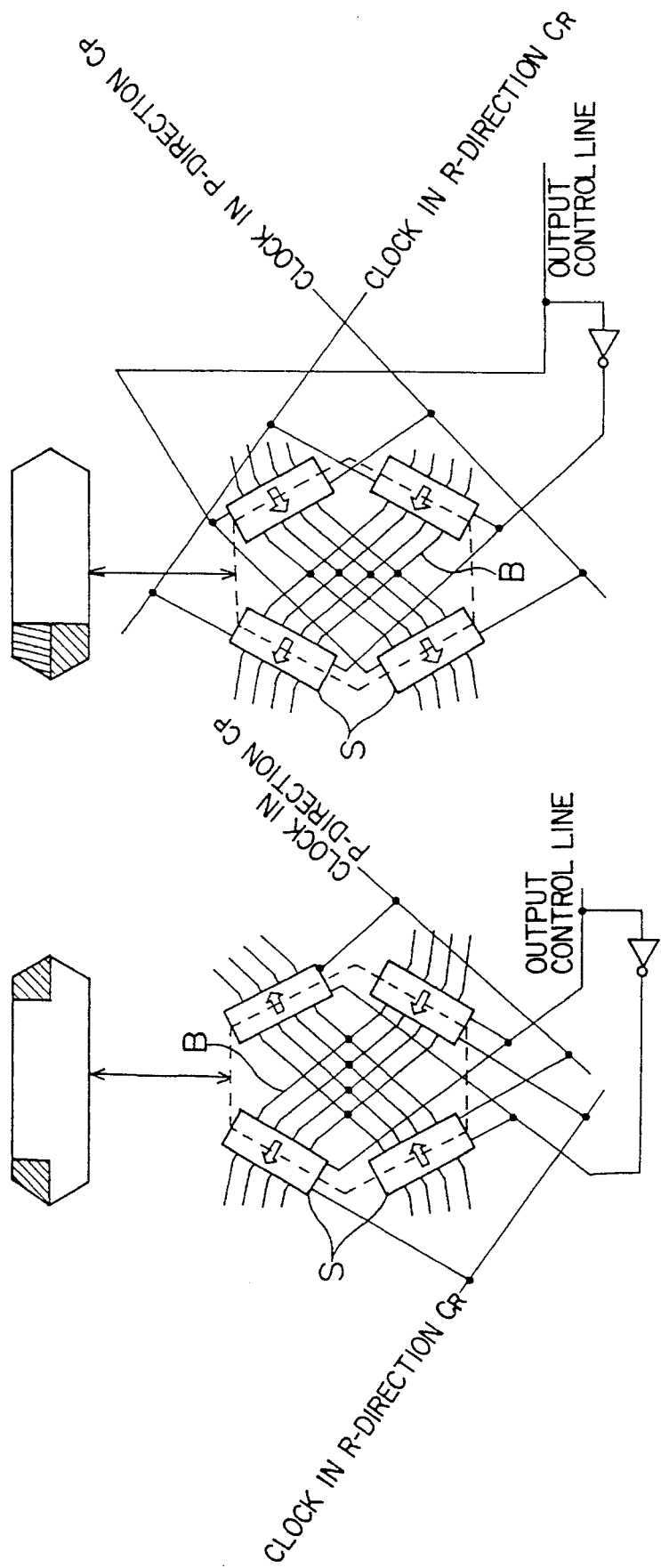
FIGS. 3a and 3b show a diagram illustrating in detail respective stages constituting the structure of the SDB of the first embodiment.

Incidentally, FIGS. 3a and 3b illustrate in detail the structure which employs parallel registers having four-bit parallel lines to digitally realize the SDB.

Figure 4:
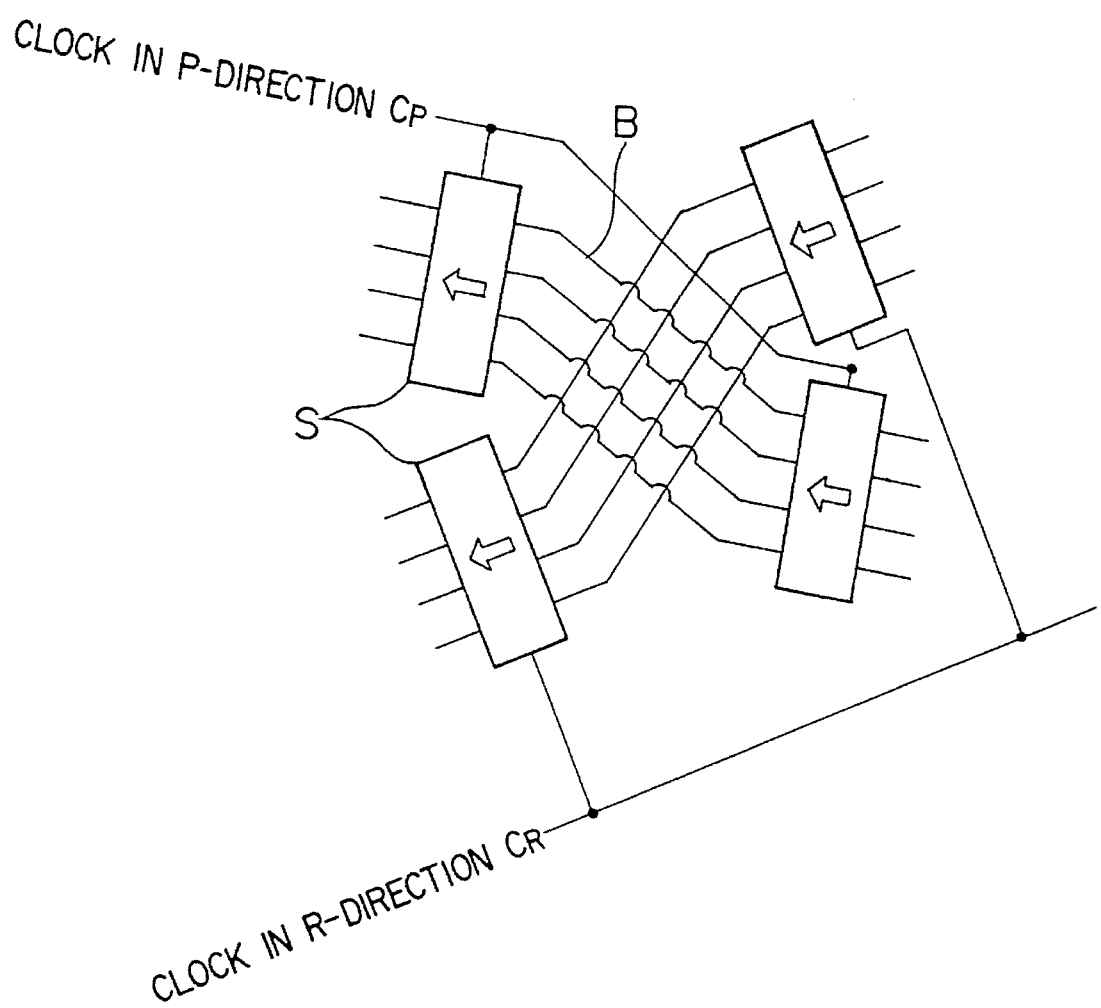
FIG. 4 is a diagram illustrating an example of a grade separation of a type in which a plurality of paths relating at intersections of each stage constituting the structure of the SDB do not share data lines.

FIG. 4, unlike FIG. 2, shows an example of a digitally implemented intersection without shared data line for reference.

Figure 7:
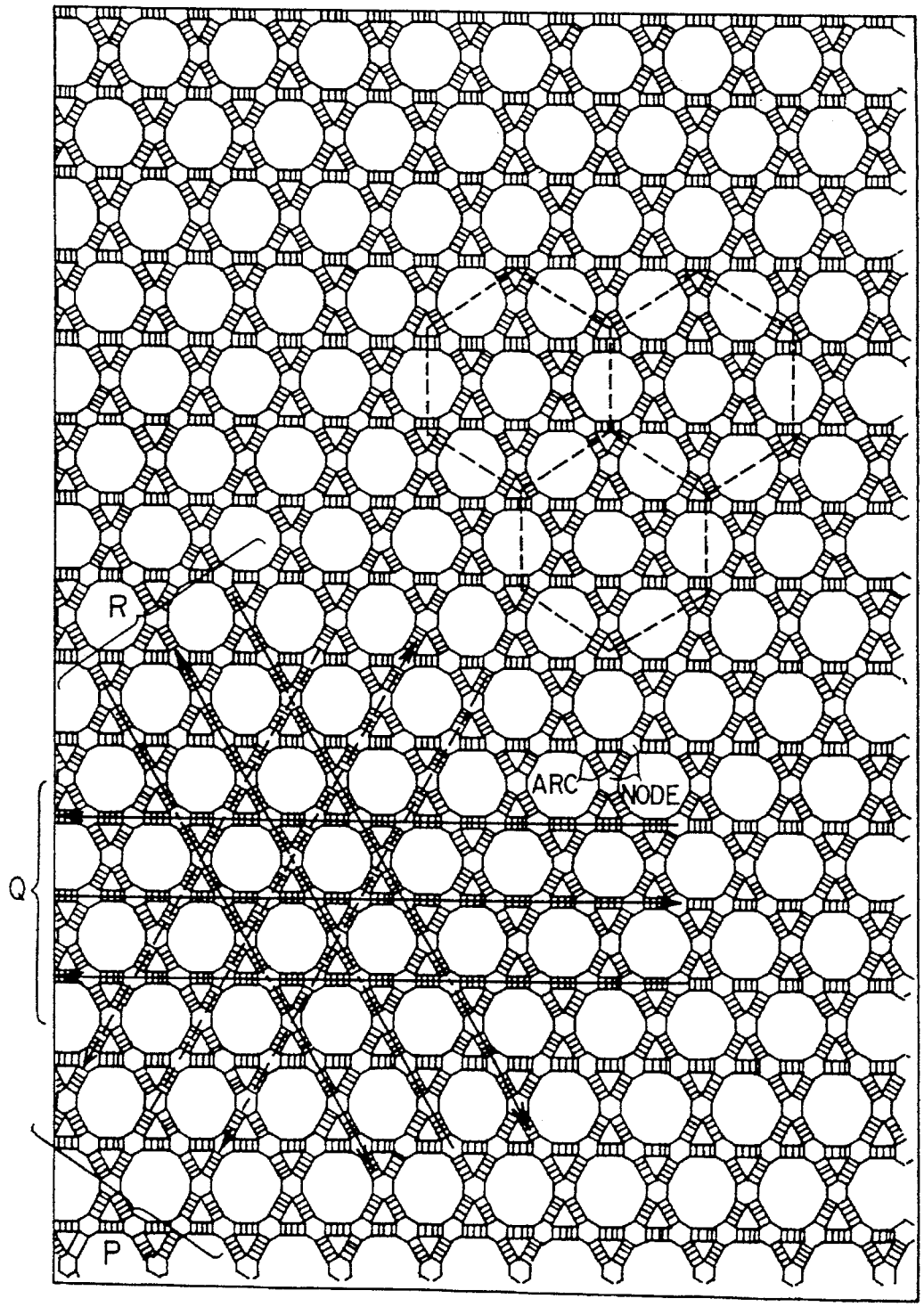
FIG. 7 is a diagram illustrating an example of an SDB having nodes and arcs, and indicates a signal trajectory when applying a predetermined specified shift.

Next, FIG. 7 illustrates an example where:
Number of paths L=3
Maximum cross degree Xmax=4
Second degree intersection ratio Y2=80%
Fourth degree intersection ratio Y4=20%.

As will be understood from FIG. 7, since this example interposes a four-stage shift register between respective SDB stages in the structure shown in FIG. 2, if five shifts in the P-, Q- and R-directions are collectively performed, a route followed by a node signal is completely identical to that of the structure shown in FIG. 2, while an arc signal presents a quite different behavior trajectory. More specifically, since the arc signal is always allocated in a stage X=2 at the time of switching the shift direction (therefore, it has only one direction from among the P-, Q- and R-directions), it intermittently moves along a single path on the SDBs.

Therefore, the resulting form is such that there exist groups of signals presenting two different kinds of behavior trajectories by the same shift operation. This may be better understood, for example, by regarding that this is similar to a case where an urban bus and a subway exist in a single town.

Figure 8:
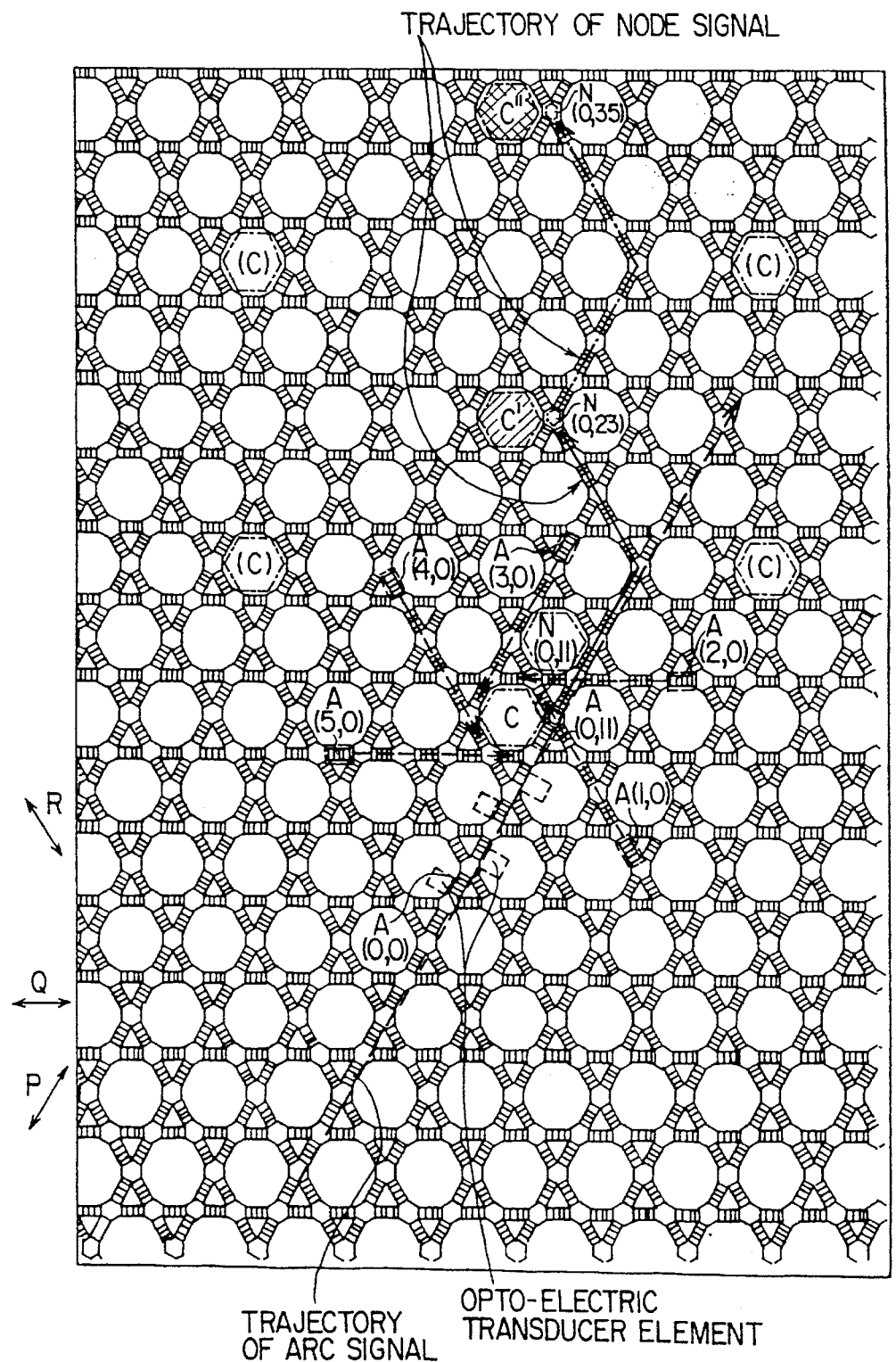
FIG. 8 shows a signal trajectory when applying a predetermined specified shift to an example of the SDB having nodes and arcs of the present invention.

FIG. 8 illustrates a signal trajectory when applying a shift specified by the following equation 2 to the example of FIG. 7.

$$V=(P5, P5, P5, P5, Q5, Q5, Q5, Q5, R5, R5, R5, R5) \quad (2)$$

where P5, Q5 and R5 indicate five shifts in the respective directions.

As will be understood from FIG. 8, since arc signals radially converge to an operation cell C from its periphery, input signals to locations on this itinerary can all be accessed by the central operation cell. Although an arc can be constituted by a single stage at minimum, if data is to be distributed to a wider region, the arc may be constituted by several stages as the example shown in FIG. 7 such that the results are used by the operation cell at each stage.

On the other hand, node signals around the operation cell generate a regular hexagonal movement similar to the example of FIG. 2. Accordingly, if in the operation of the equation 2, operation cells similar to the cell C are appropriately located as illustrated such that the operation results are relocated on the SDB as node signals upon switching the transfer direction, the operation results from the six cells C can be collected around the next operation cell C' upon completion of a series of the next shifts. It is further possible to transfer the operation results to other cells C", C''' and so on, if necessary, to multiplex other operations.

It goes without saying that an output signal can be transferred not only as a node signal but also as an arc signal in a direct manner. After all, this structure advantageously allows a selection to be made as to which of a bus or a subway is to be taken.

Since the contents of the operation cell is not related to the present invention, a detailed description thereof will be omitted. However, as examples, FIGS. 9 and 10 respectively illustrate an analog operation cell and a digital operation cell for a weighted OR operation suitable for the SDB structured as shown in FIG. 7.

Figure 9:
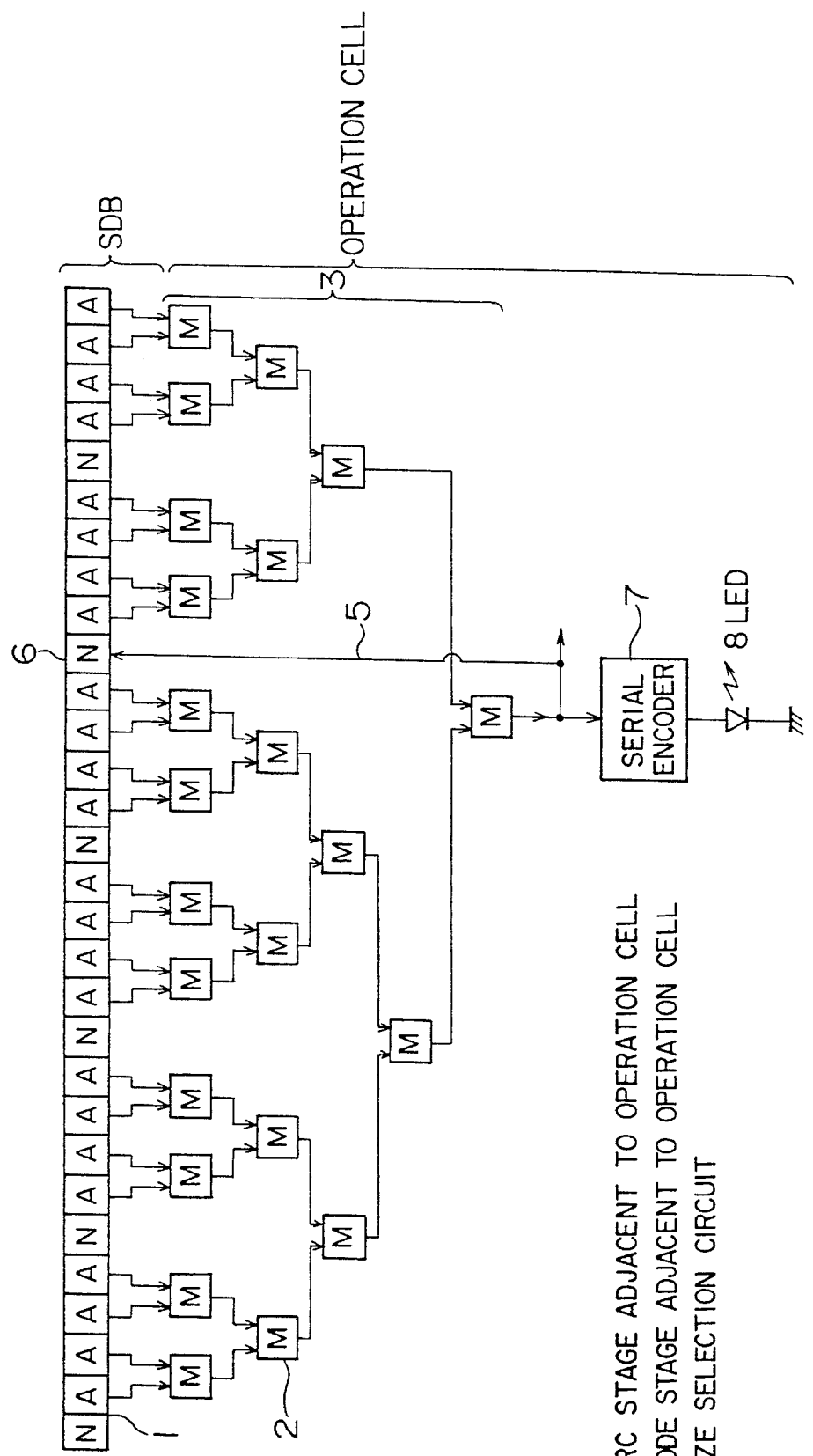
FIG. 9 is a diagram illustrating the structure of a maximum value calculating circuit which is incorporated in a digital SDB according to an embodiment of the present invention.

Referring to FIG. 9, reference numeral 1 designates a stage for realizing a signal from an arc. Data realized per five shifts is sequentially transferred to a shift register 2 subsequent to the stage 1. At the time all data has been prepared, the output of a weighted OR circuit 3 is determined by a FGA (Floating Gate Amplifier) type transversal filter, and is outputted by a charge output means 5 to a node 6 as a charge signal.

Though not shown in particular, the weighted OR circuit 3 may be directly installed on the arc of the SDB without the intervention of the stage 1 and the shift register 2 to realize a similar function, whereby a signal moving on the arc can be non-destructively utilized, if necessary.

The operation cell shown in FIG. 9 also has a structure for driving an LED 8 by the output through a modulating means 7 to derive the operation results in the form of an optical signal.

Figure 11:
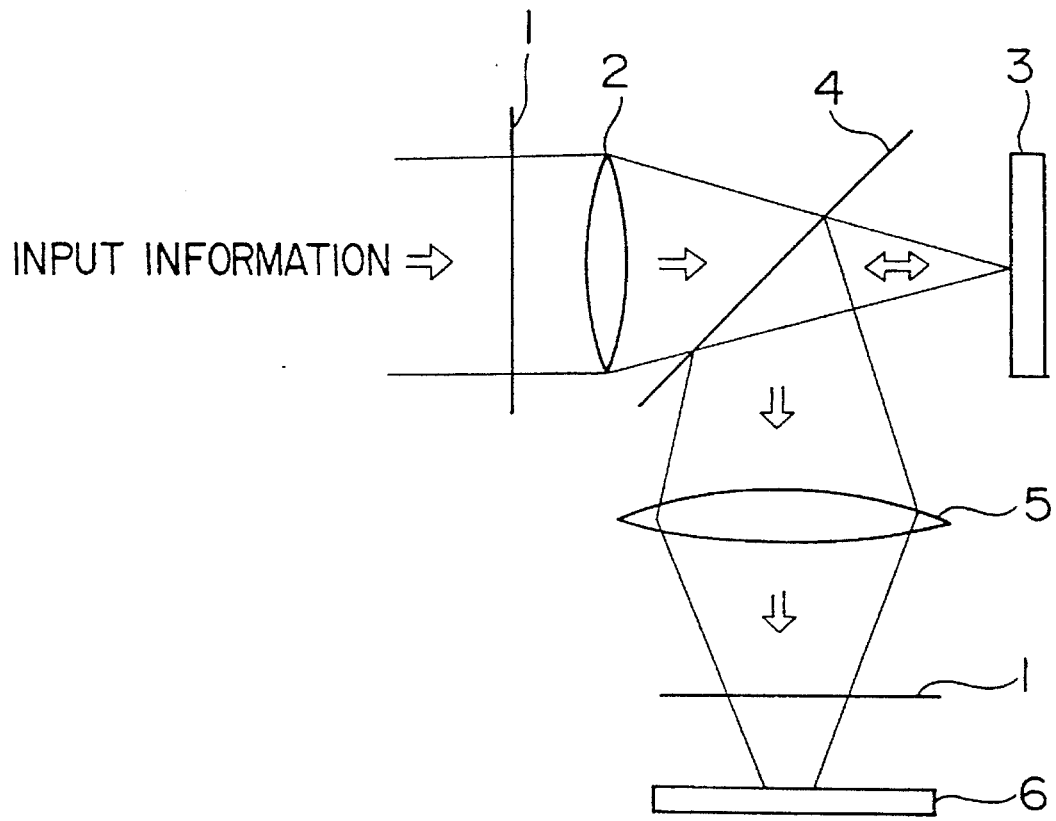
FIG. 11 is a diagram illustrating the structure of an output detecting means of the SDB which is also provided with an optical output means according to another embodiment of the present invention.

FIG. 11 illustrates an example of an optical system in which this apparatus is incorporated.

Figure 10:
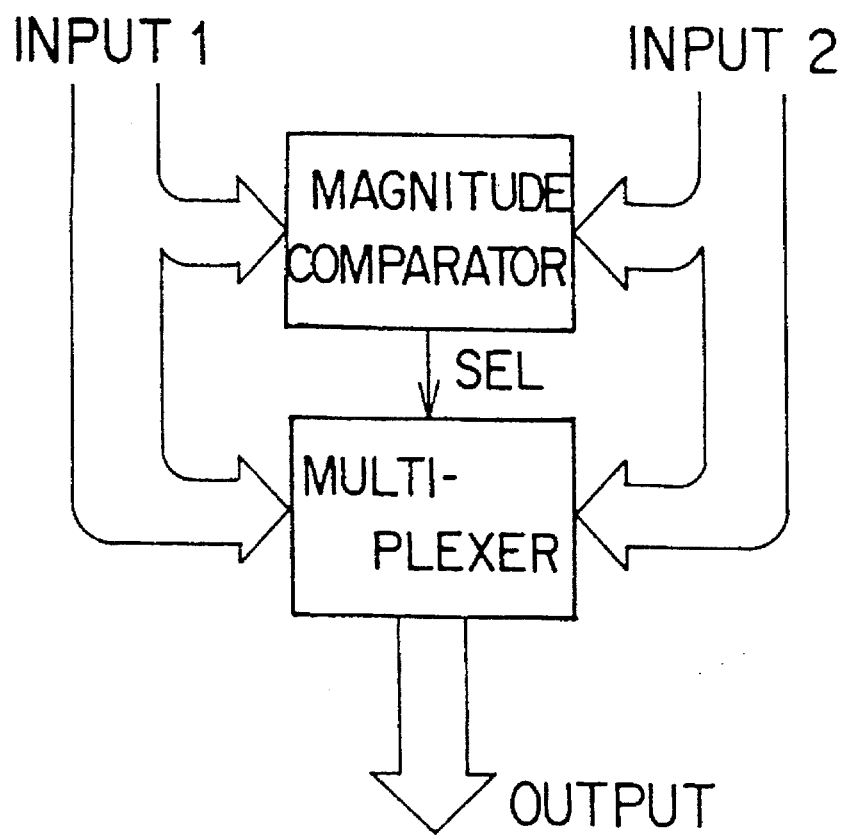
FIG. 10 is a diagram illustrating in detail a size selection circuit which is incorporated in the digital SDB of the embodiment.

FIG. 10 illustrates an example of a structure in which a maximum value calculating cell is incorporated in a digital SDB. Referring to FIG. 10, (A) designates an arc located on an SDB; (N) a node: and (M) a size selection circuit. They, as a whole, calculate a maximum value on the basis of a tournament method. Since the operation thereof is apparent, explanation thereof will be omitted.

Referring now to FIG. 11, reference numeral 1 designates an optical filter; 2 a primary focusing system; 3 a circuit including the SDB according to the present invention; 4 a mirror for selectively reflecting an output light; 5 a secondary focusing system; and 6 a detector for detecting an output signal.

As a specific application, an example will next be given where the SDB is applied to a system of extracting contour information in the visual sense.

Figure 12:
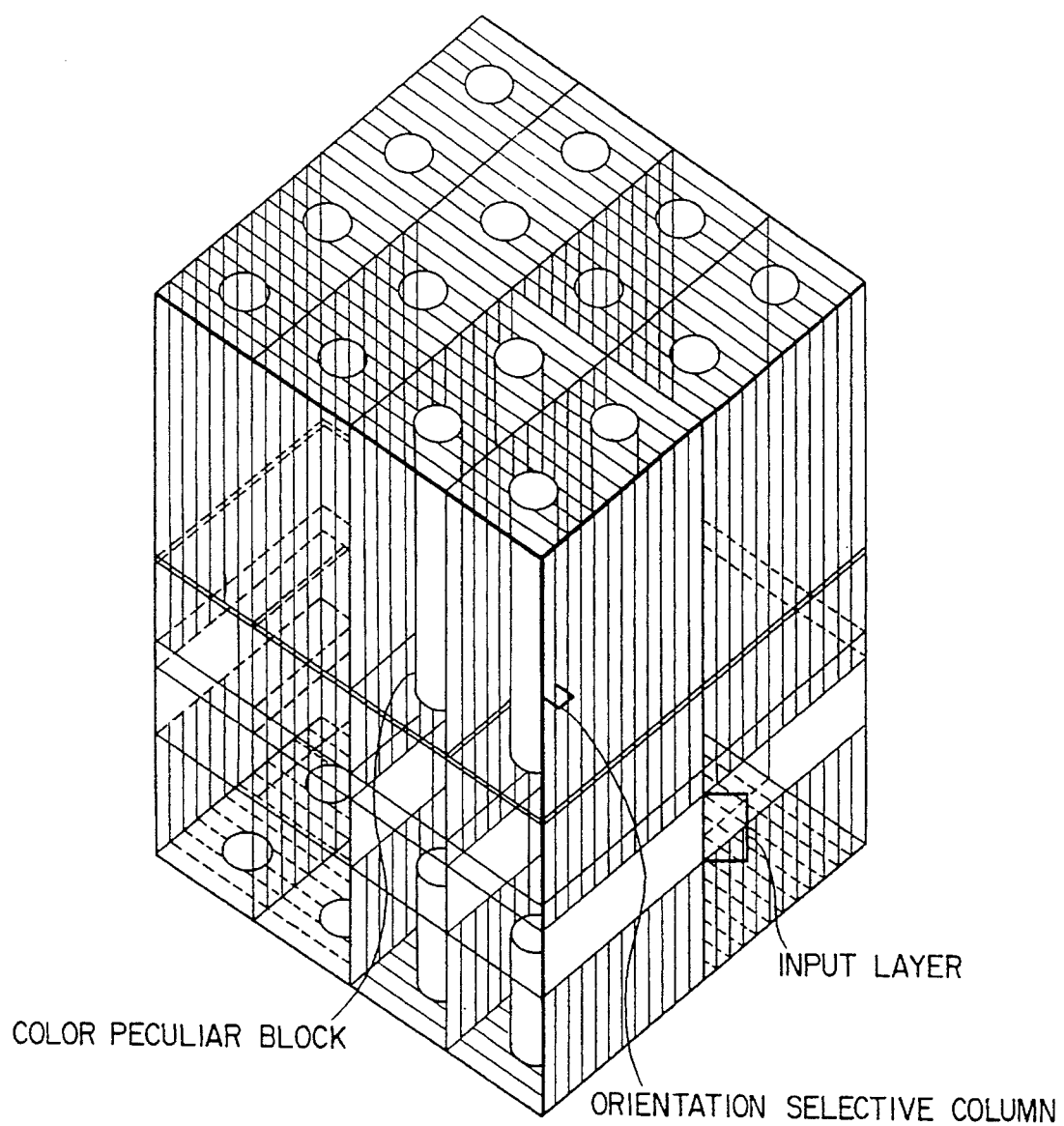
FIG. 12 illustrates a structure in which color peculiar blobs and orientation selective columns are regularly arranged in a region having a deep corresponding relationship with the retina called a hypercolumn structure.

It is known in general that a region deeply related with the retina called "hypercolumn structure" exists in the primary visual field of the cerebrum of Mammalia. Individual hypercolumns macroscopically have a relation corresponding to points on retinas of the left and right eye-balls, as shown in FIG. 12, and have the structure in which "a color peculiar" mainly reacting to colors and "an orientation selective column" reacting only to lines having a particular slope are regularly arranged.

Here, explanation will be given of a case where a function similar to the orientation selective column is realized by the SDB. The SDB employed herein and its driving manner are substantially the same as those which have been explained in connection with FIGS. 7 and 8, the specific configuration of which may be in an analog or digital form.

Figure 13:
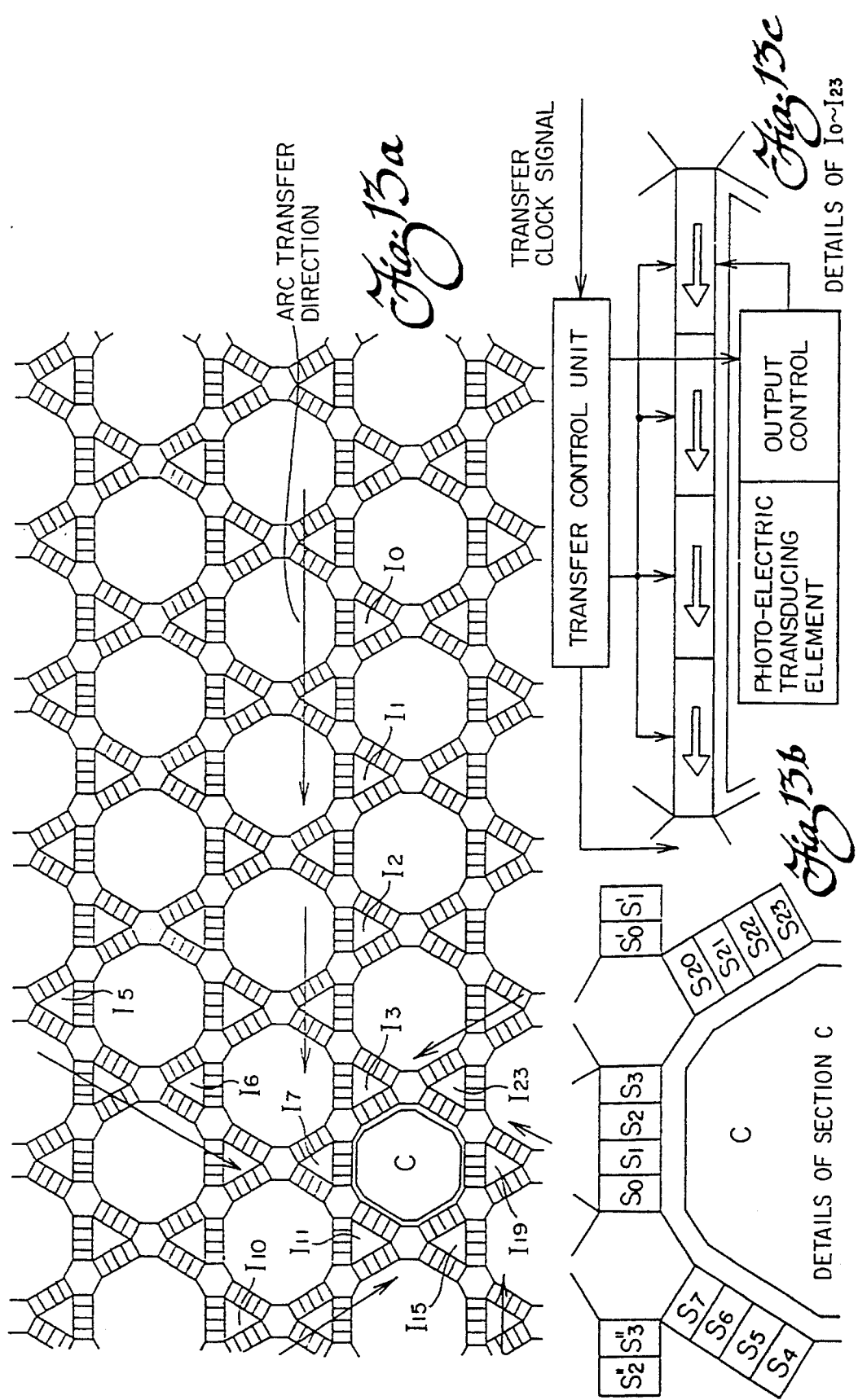
FIGS. 13a–13c are a diagram illustrating the structure for realizing optical data, according to an embodiment of the present invention, and shows an input form of peripheral data utilizing an arc bus.

First, an optical data realizing method is shown in FIGS. 13a–13c. I0-23 designates an input cell, and C an operation cell. The input cell converts an optical input at that location to a logarithmic value and transfers data onto adjacent arcs.

In this event, nodes located on both sides of the arc, i.e., sandwiching the arc to which the input is to be transferred, stop transferring once so as to delete the oldest data on the arc.

At the time the input is completed, therefore, an arc is holding past four input data which are always updated. When the input reaches the operation cell C, an input value S0–23 from the input cell I0-23 is regularly arranged.

Incidentally, FIGS. 13a–13c show the structure for directly realizing optical information using the input cell I0-23, however, this optical information may be, for example, the operation result such as an average value of peripheral data collected by the SDB which is at a lower degree.

Figure 14:
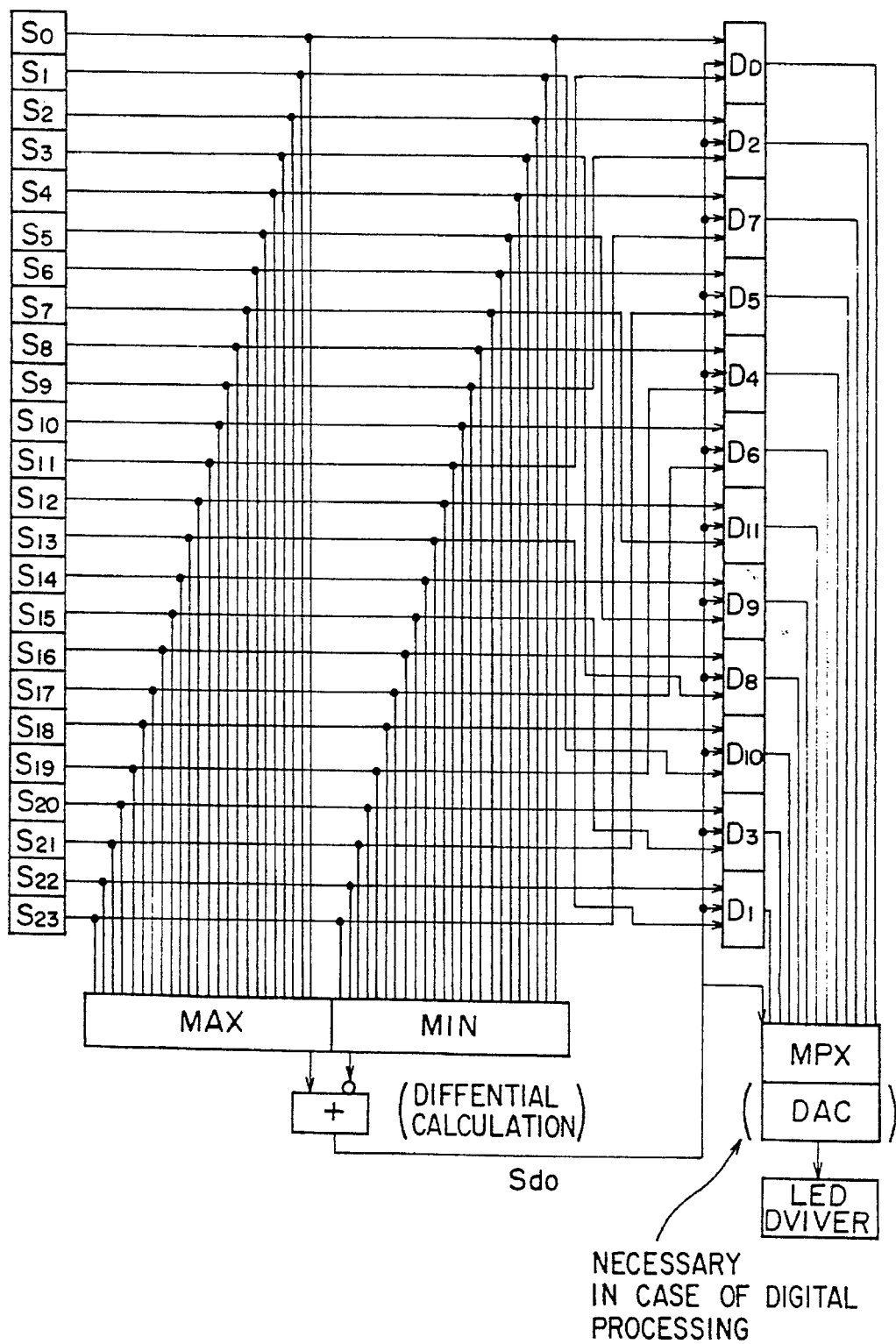
FIG. 14 is a diagram illustrating in detail the interior of an operation cell according to an embodiment of the present invention.

The data thus converged to arcs around the operation cell C is subjected to a calculation processing shown in FIG. 14.

Specifically, the dynamic range of signals around the operation cell C is calculated using data S. Since the inputs S are all logarithmic values, the dynamic range can be readily calculated from the difference Sd0 between a maximum value and a minimum value.

Next, referring to FIGS. 15a and 15b, the inputs S are used in a unit D to calculate an absolute value of the difference Sdij between two values in a particular combination (Sdij=|Si−Sj|) which is naturally a positive value below Sd0. Therefore, output data ranging between 0 and Sd0 is derived by subtracting the value Sdij from Sd0.

Qualitatively explaining, if the dynamic range of inputs around the operation cell C is low, that is, if the brightness around the operation cell C is substantially uniform, the output of the unit D also becomes low. Conversely, if the dynamic range of inputs around the operation cell C is high, that is, if the brightness around the operation cell C is irregular, the output of the unit D presents different values ranging from 0 to Sd0 depending on the value of Sdij. The output of the unit D is larger as the dynamic range Sd0 is larger or the difference between two data is smaller. As a result, this value presents a strong reaction against the direction of equi-brightness curves around the operation cell C.

Figure 15A:
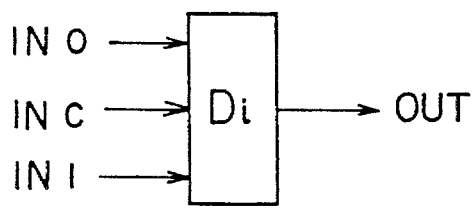
FIGS. 15a and 15b show a diagram illustrating a calculation circuit Di for digital calculation according to an embodiment of the present invention.

In FIG. 15a, the circuit Di is also provided with an output device for transmitting the outputs of the respective units D by LED in a time-division manner. If this output device is arranged such that an operation cell having a function similar to that of the operation cell C disposed on the SDB synchronously delivers a like output in parallel, points including lines in the same direction are simultaneously lit on the screen. If this result is accumulated, contour lines can be extracted from the input screen. Also, if the data is observed in a time-division manner, it directly corresponds to the reaction of "the orientation selective column," thereby making it possible to provide information useful, for example, for processing of multiple-lens visual information.

Figure 15B:
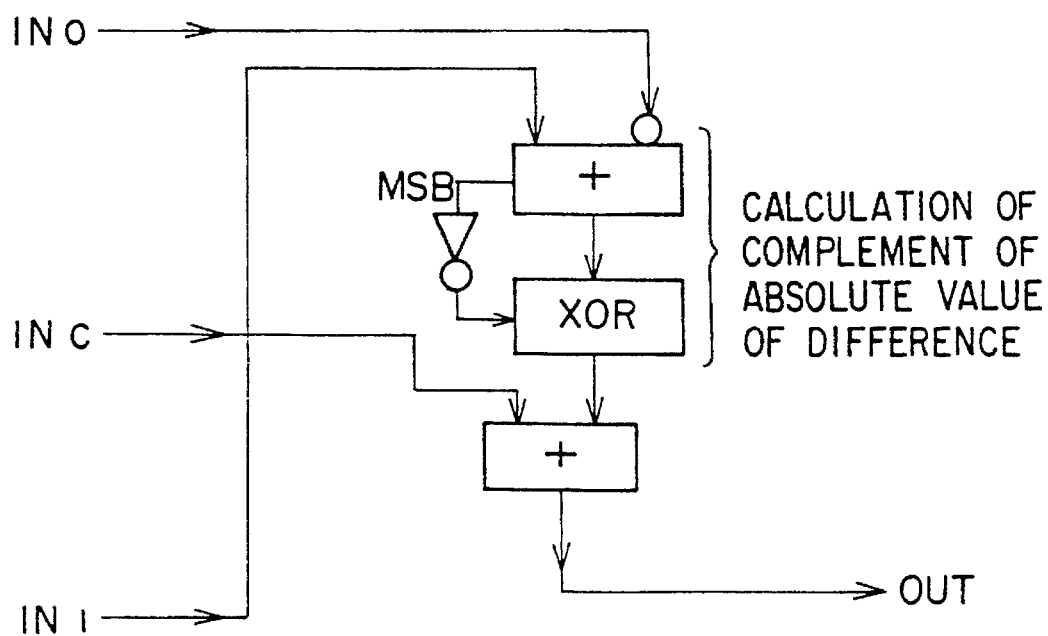

Incidentally, it goes without saying that processors shown in FIGS. 14, 15a and 15b may be replaced by small-scale Neumann type microprocessors.

Figure 16A:
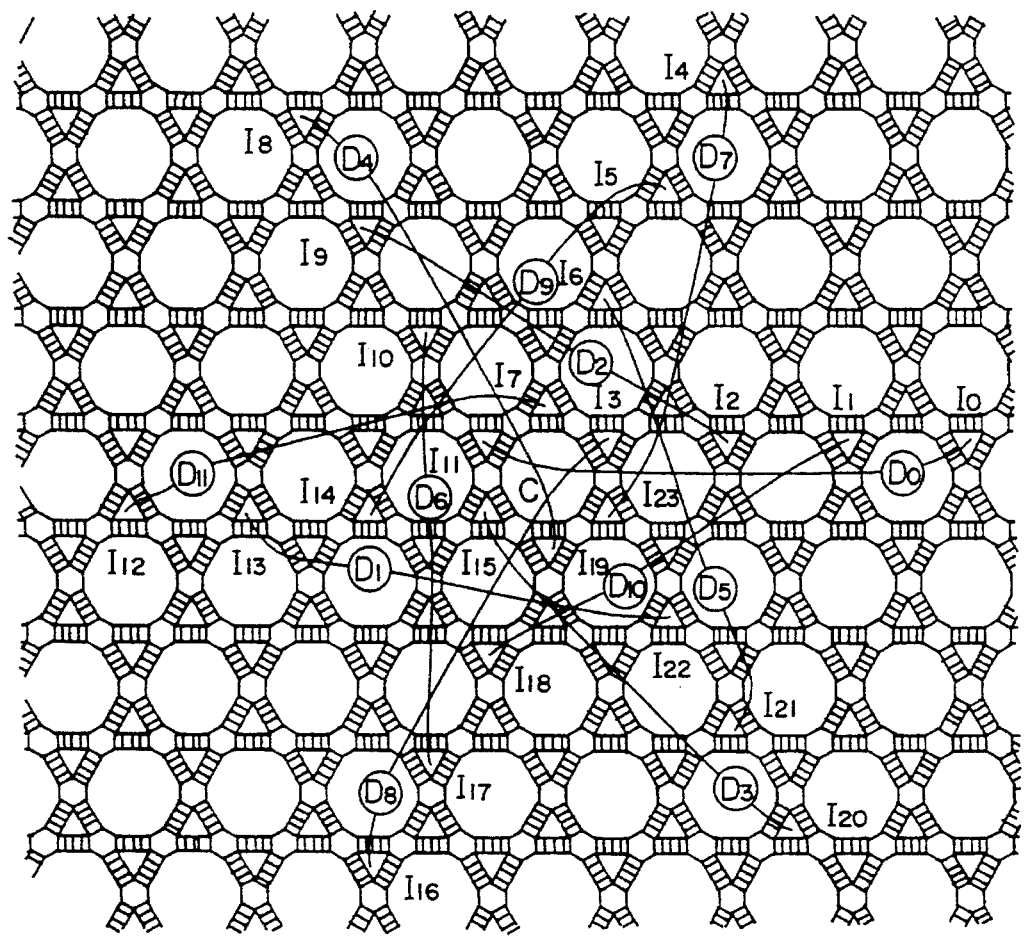
FIGS. 16a and 16b show an explanatory diagram indicating the direction of lines calculated by the calculation circuit Di shown in FIGS. 15a and 15b.
Figure 16B:
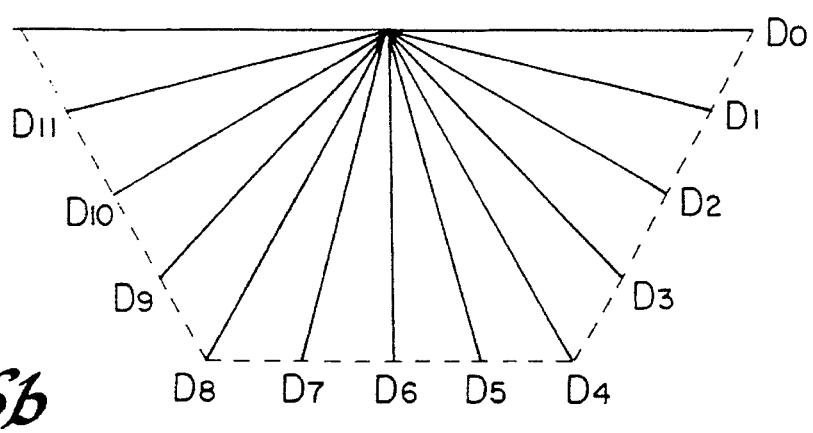

FIGS. 16a and 16b show the directions of lines determined by a circuit Di appearing in FIG. 14. As will be understood from FIGS. 16a and 16b, a combination of inputs to the circuit Di employed in FIG. 14 is, when looking back on input points I0-I23, a combination of input points representing lines which have an angle derived by equally dividing the azimuth of 180° by 12.

The example shown in FIGS. 13a–13c have been described on the assumption that an SDB having both arc and node stages is employed. When the node stage is not utilized, the system can be made simpler if intersections of the SDB are configured as shown in FIG. 4.

As conclusion, the present invention has the following advantages:

(1) In comparison with a conventional systolic array type parallel computer, a mutually communicable area of computers is expanded, thereby realizing an environment where each computer can exchange data in parallel with other 50—several thousand computers which exist therearound. This environment is directly applicable, for example, to a field where local data is mainly referenced such as a neural network.

(2) Since output signals of respective computers can be repeatedly exchanged with each other, the serialization of processing permits the operation resources to be effectively utilized. (If the processing is advanced while switching software of the computer every time the processing is once completed, a complicated processing is carried out by utilizing the same computer many times.)

(3) Since the data exchange form can be diversely modified by a driving schedule of the SDB, a flexible application is enabled as compared with a systolic array or the like. (If the order of shifts is changed, the same results as changing the wiring is obtained, whereby the data exchange form can be changed according to the object to some extent.)

(4) Similarly to a systolic array system, the total connection amount is in proportion to the space complexity, so that even if the parallel degree increases, the connection amount will not explosively increase like other systems, thereby making it possible to efficiently configure integrated circuits. (Since connections are not necessary with computers at remote locations, all computers may only have a fixed amount of wiring regardless of the expansion of the scale.)

I claim:

1. An apparatus for relocating spatial information comprising:

a plurality of groups of plural independent data paths with each independent data path being composed of a shift register having a number of signal storage means arranged in cascade connection via data lines, said plural independent data paths of each group being located in non-intersecting manner, at least one of said data paths of each group being adapted to transfer a signal inputted thereto in a different direction from at least one of the remaining data paths thereof when the shift register thereof is operated;

said plurality of groups of plural independent data paths being arranged such that each independent data path of one group shares with at least one independent data path of another at least one group at least one data line at at least one position of said plural independent data paths except end positions thereof; and said at least one shared data line effecting transfer operation of a signal within one time interval independently allotted to each of said plurality of groups of plural independent data paths, thereby permitting said signal on said at least one shared data line to be transferred in a direction designated for each of said plurality of groups of plural independent data paths when each of said plurality of groups of plural independent data paths has effected the transfer operation of a signal.

2. An apparatus for relocating spatial information according to claim 1, wherein said shift registers are analog shift registers.

3. An apparatus for relocating spatial information according to claim 2, wherein said analog shift registers are CCDs.

4. An apparatus for relocating spatial information according to claim 1, wherein said shift registers are digital data shift registers.

5. An apparatus for relocating spatial information according to claim 1, wherein the number of said path groups is at least three.

6. An apparatus for relocating spatial information according to claim 1, wherein at least some of said shift registers are provided with an opto-electric device to directly detect an external optical stimulus as an analog electric signal.

7. An apparatus for relocating spatial information according to claim 1, further comprising a plurality of calculation means which are dispersively located to perform a variety of calculations based on electric signals held by a plurality of adjacent shift registers.

8. An apparatus for relocating spatial information according to claim 7, further comprising means for returning an electric signal representing the calculation result derived by said calculation means to a shift register stage located on said path.

9. An apparatus for relocating spatial information according to claim 7, further comprising means for converting the calculation result to an electromagnetic wave output signal modulated by said signal representing the calculation result.

10. An apparatus for relocating spatial information according to claim 9, wherein said electromagnetic wave output signal is an optical signal.

11. An apparatus for relocating spatial information according to claim 1, wherein said shift registers in the same path group alternately perform transfers in the opposite directions.

12. An apparatus for relocating spatial information according to claim 1, wherein at least some of said shift registers are provided with an opto-electric device to directly detect an external optical stimulus as a digital electric signal.

13. The apparatus for relocating spatial information according to claim 1, wherein said shift register is a digital shift register and said data line is an electrical conductor which connects between two storage means of said shift register.

14. The apparatus for relocating spatial information according to claim 1, wherein said shift register is of a type in which a signal is moved as a packet of electrons and said data line is a charge transfer gate which couples between two storage means of said shift register.

15. The apparatus for relocating spatial information according to claim 1, wherein said shift register is an analog shift register and said data line is an electrical conductor which connects between two storage means of said shift register.

16. The apparatus for relocating spatial information according to claim 15, wherein said shift register is of a type in which a signal is moved as a packet of electrons and said data line is a charge transfer gate which couples between two storage means of said shift register.

17. An apparatus for relocating spatial information comprising:
- a plurality of groups of plural independent data paths with each independent data path being composed of a shift register having a number of signal storage means arranged in cascade connection via data lines, said plural independent data paths of each group being located in non-intersecting manner, at least one of said data paths of each group being adapted to transfer a signal inputted thereto in a different direction from at least one remaining data path thereof when the shift register thereof is operated;
- means for connecting said plurality of groups of plural independent data paths in such a manner that each independent data path of one group intersects with at least one independent data path of another group at respective data lines of said one group and said another group; and
- means for effecting the operation of said shift registers in each data path group to transfer a signal in a direction defined by each of said shift registers operated, said shift register operating means further effecting the operation of said shift registers in only one of said plurality of data path groups within one time interval independently allotted to each of said groups when a signal comes into an intersection between said plurality of data path groups, thereby permitting said signal on said intersection to be transferred along one independent data path of the group, the shift registers of which have been operated.

18. The apparatus for relocating spatial information according to claim 17, wherein each shift register is a digital shift register and said data lines are electrical conductors which connect between two storage means of said shift register.

19. The apparatus for relocating spatial information according to claim 17, wherein each shift register is of a type in which a signal is moved as a packet of electrons and said data lines are charge transfer gates which couple between two storage means of said shift register.

20. The apparatus for relocating spatial information according to claim 17, wherein each shift register is an analog shift register and said data lines are electrical conductors which connect between two storage means of said shift register.

21. The apparatus for relocating spatial information according to claim 20, wherein each shift register is of a type in which a signal is moved as a packet of electrons and said data lines are charge transfer gates which couple between two storage means of said shift register.

* * * * *